United States Patent [19]
Wasa et al.

[11] 3,964,033
[45] June 15, 1976

[54] ELECTROOPTIC STORAGE DEVICE

[75] Inventors: Kiyotaka Wasa, Nara; Shunichiro Kawashima, Amagasaki; Shigeru Hayakawa, Hirakata, all of Japan

[73] Assignee: Matsushita Electric Industrial Co., Ltd., Osaka, Japan

[22] Filed: Dec. 2, 1974

[21] Appl. No.: 528,868

[52] U.S. Cl. .................... 340/173.2; 340/173 LM; 350/157; 350/160 R
[51] Int. Cl.² .................. G11C 11/22; G11C 13/08
[58] Field of Search .................. 340/173.2, 173 LM; 350/157, 160 R

[56] References Cited
UNITED STATES PATENTS

| | | | |
|---|---|---|---|
| 3,272,988 | 9/1966 | Bloom et al. | 250/199 |
| 3,693,171 | 9/1972 | Asam | 340/173 LM |
| 3,740,734 | 6/1973 | Maldonado | 340/173 LM |

OTHER PUBLICATIONS

Smith et al., Ferroelectric Ceramic Light Scattering Devices for Image Storage and Display, Conference 1972 SID Symposium Digest of Technical Papers, pp. 14 & 15, 6/6–8/72 S2781-0108.

Jacobs, et al., Thermal Capacitive–Ferroelectric Storage Device, IBM Technical Disclosure Bulletin, vol. 15, No. 4, 9/72, pp. 1294–1295, S30510065.

*Primary Examiner*—Stuart N. Hecker
*Attorney, Agent, or Firm*—Wenderoth, Lind & Ponack

[57] ABSTRACT

An electrooptic storage device having a transparent, ferroelectric ceramic plate, one pair of writing electrodes on opposite surfaces of the ferroelectric ceramic plate, respectively, and one pair of erasing electrodes on opposite edges, respectively of the ferroelectric ceramic plate, the writing electrodes each being a thermally sensitive transparent resistor layer. This device is a device capable of reversible image storage.

8 Claims, 5 Drawing Figures

ELECTROOPTIC STORAGE DEVICE

BACKGROUND OF THE INVENTION

This invention relates to an electrooptic storage device, and more particularly to a novel and improved electrooptic ceramic storage and display device.

Various kinds of electrooptic storage devices utilizing electrically controlled birefringence or scattering and which are composed of a ferroelectric ceramic have been developed in connection with the manufacturing of a display device. However, the electrooptic storage devices have a large drawback in that the devices of this type can be used only for an irreversible image storage system. Although there are several improved devices which are capable of reversibly storing images, they still have some disadvantages. For example, some improved electrooptic storage devices have a short service life.

SUMMARY OF THE INVENTION

It is a principal object of this invention to provide a novel and improved electrooptic storage device which overcomes the above-noted disadvantages of the prior art.

It is another object of this invention to provide a novel and improved electrooptic storage and display device utilizing a transparent ferroelectric ceramic which is capable of reversible image storage.

These objects are achieved by providing an improved construction of the electrooptic storage device according to this invention which comprises a ferroelectric plate, one pair of writing electrodes facing to both surfaces of the ferroelectric plate, respectively, and one pair of erasing electrodes on the opposite edges, respectively, of the ferroelectric plate, the writing electrodes each being a thermally sensitive transparent resistor layer.

DESCRIPTION OF THE PREFERRED EMBODIMENT

Figure 1:
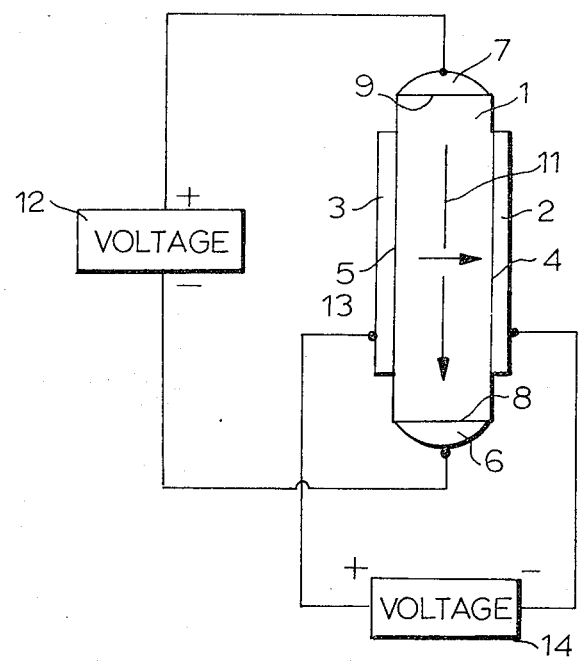
FIG. 1 is a schematic end elevation view and circuit diagram of the electrooptic storage device according to the present invention.

Referring to FIG. 1, the electrooptic storage device 10 in accordance with the present invention comprises a ferroelectric plate 1, one pair of writing electrodes 2 and 3 on opposite surfaces 4 and 5 of the ferroelectric plate, respectively, and one pair of erasing electrodes 6 and 7 deposited on opposite edges 8 and 9, respectively, of the ferroelectric plate.

The ferroelectric plate is made of suitable material which is transparent, such as hot-pressed PLZT (lanthanum doped lead zirconate-titanate ceramic). The writing electrodes are made of a thermally sensitive resistor material transparent layer, such as vanadium oxide. The erasing electrodes can be made of any conventional conductive metal such as gold, silver and aluminum.

In the electrooptic storage device 10 in accordance with this invention, the ferroelectric plate is initially poled in a direction 11 parallel to the surfaces 4 and 5 of the ferroelectric plate by applying voltage 12 across the erasing electrodes. The optical transparency of the ferroelectric plate can be controlled by changing the direction of the poling axis 11 so that it is in direction 13 by applying a poling voltage 14 across the writing electrodes which have high electrical conductance. The variations of the optical transparency in the ferroelectrical plate are useful for making optical switching, information storage, and information display devices.

Devices of this type generally carry out an irreversible operation as described hereinbefore. This is because the ferroelectric plate cannot be re-poled into the initial poling direction 11 due to the presence of the highly conductive writing electrodes.

Figure 2:
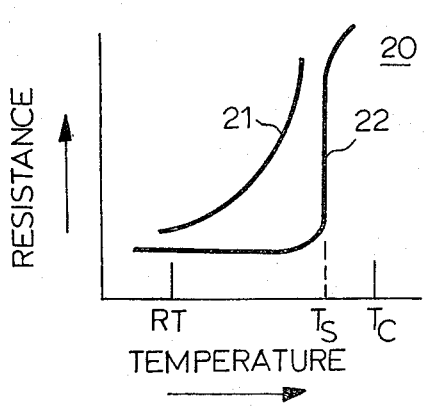
FIGS. 2 and 3 are graphs of the characteristics of the device of FIG. 1.

It has been discovered in accordance with this invention that devices of this type can be caused to carry out reversible operation. In the devices in accordance with this invention, the writing electrodes are made of a thermally sensitive transparent resistor material having, for instance, a positive temperature coefficient of electrical resistance. Referring to FIG. 2, typical temperature-resistance characteristics are shown in curve 21 and curve 22. The curve 21 exhibits gradual increase in resistance with an increase of ambient temperature, and the curve 22 shows a abrupt increase in resistance at switching temperature Ts. The temperature Ts should be lower than the Curie temperature Tc of the ferroelectric plate. The writing electrodes 2 and 3 consisting of the thermally sensitive resistor material having the positive temperature coefficient have a high resitance at a high temperature such as Ts so that the ferroelectric plate can be re-poled in the direction 11 by applying a poling voltage across the erasing electrodes 6 and 7 when the ferroelectric plate is kept at a high temperature such as Ts. On the other hand, the writing electrodes 2 and 3 consisting of said thermally sensitive resistor having said positive temperature coefficient have a low resistance at a low temperature such as RT so that the ferroelectric plate can be re-poled in the direction 13 by applying poling a voltage across the writing electrodes 2 and 3 when the ferroelectric plate is kept at a low temperature such as RT. The thermally sensitive resistor material having a positive temperature coefficient of resistance can be made of suitable inorganic materials such as Se, $(Ba,Sr, Pb)TiO_3$, $ZnO$-$TiO_2$-$NiO$, $Pb(Fe_{1/2}Nb_{1/2})O_3$, and $CdO$-$Bi_2O_3$ or organic materials such as paraffine, polyethylene, and graphite.

It has also been discovered in accordance with this invention that writing electrodes comprising thermally sensitive transparent resistor material having a negative temperature coefficient of electrical resistance can also be used for making the electrooptic storage device capable of reversible operation.

Figure 3:
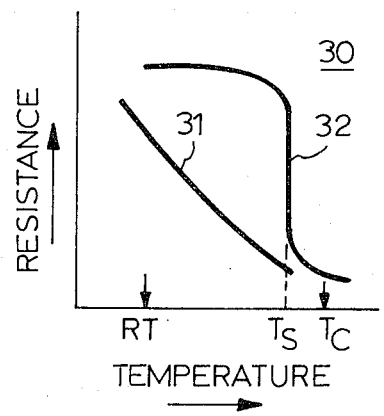

Referring to FIG. 3, typical temperature-resistance characteristics are shown in curve 31 and curve 32. The curve 31 shows a gradual decrease in resistance with an increase of ambient temperature, and the curve 32 shows an abrupt decrease in resistance at switching temperature Ts. The temperature Ts should be lower than the Curie temperature Tc of the ferroelectric plate. The writing electrodes 2 and 3 consisting of the thermally sensitive resistor material having the negative temperature coefficient of resistance have a high resistance at low temperature such as RT so that the ferroelectric plate can be re-poled in the direction 11 by applying a poling voltage across the erasing electrodes 6 and 7 when the ferroelectric plate is kept at a low temperature such as RT. On the other hand, the writing electrodes 2 and 3 consisting of the thermally sensitive resistor material having the negative temperature coefficient of resistance have low resistance at a high temperature such as Ts so that the ferroelectric plate can be re-poled in the direction 13 by applying a poling voltage across the writing electrode 2 and 3 when the ferroelectric plate is kept at a high temperature such as Ts. The thermally sensitive resistor having the negative temperature coefficient of resistance can be made of suitable inorganic materials such as Si, Ge, $Ag_2S$, $Ag_2S$-CuS, $V_2O$, VO, $VO_2$, $Ti_2O_3$ or organic materials such as isoviolanthrone.

From above description, it is evident that the electrooptic storage device in accordance with this invention can carry out reversible operations of image storage and/or display simply by changing the ambient temperature.

In the electrooptic storage device in accordance with this invention, when the ferroelectric plate is made of a coarse-grained ceramic, an important electrooptic effect is the dependence of the light scattering properties on the orientation of the ceramic polar axis relative to the incident light propagation direction. On the other hand, when the ferroelectric plate is made of a fine-grained ceramic, the ceramic plate exhibits electrically variable birefringence. The device according to this invention is very suitable for the manufacturing of information (image) storage and/or display devices.

Figure 4:
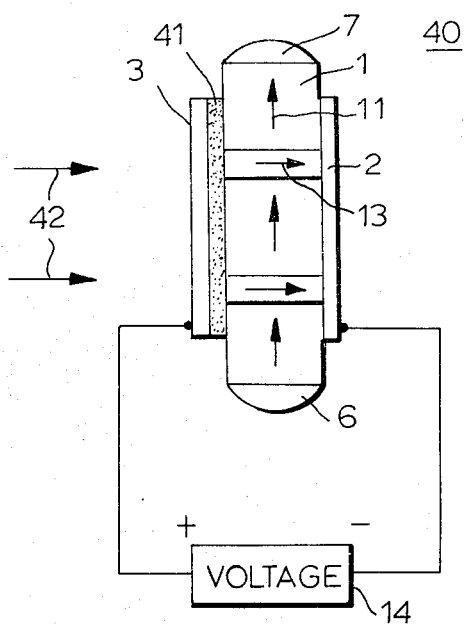
FIGS. 4 and 5 are views similar to FIG. 1 of modified forms of the device according to the invention.

An improved electrooptic storage device in accordance with this invention is shown in FIG. 4. Referring to FIG. 4, the electrooptic storage device 40 (for information storage or display) in accordance with this invention comprises a transparent ferroelectric ceramic 1 plate, one pair of transparent thermally sensitive writing electrodes 2 and 3 on opposite surfaces of the ferroelectric plate, respectively, a photosensitive layer 41 placed between one of the surfaces of ferroelectric plate and one of the transparent thermally sensitive writing electrodes and one pair of erasing electrodes 6 and 7 on opposite edges of the ferroelectric plate, respectively.

When the photosensitive layer 41 is made of a photoconductive material such as CdS and CdSe, and a poling voltage 14 is applied across the writing electrodes 2 and 3 which are irradiated by a light pattern 42, a pattern which is the same as that of the light pattern is stored in the ferroelectric plate in the form of differently polarized regions of the transparent ferroelectric ceramic. Patterns stored in the ferroelectric plate can be used for information storage or display devices as described hereinbefore.

Figure 5:
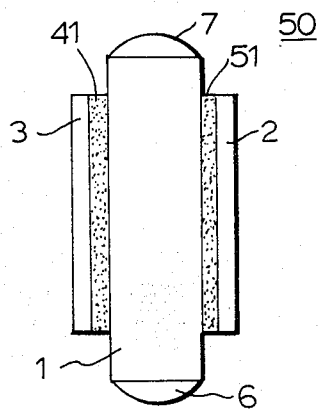

Another type of improved electrooptic storage device for information storage or display in accordance with this invention is shown in FIG. 5. Referring to FIG. 5, the device 50 in accordance with this invention comprises a transparent ferroelectric ceramic plate 1, one pair of transparent thermally sensitive writing electrodes 2 and 3 on opposite surfaces of the ferroelectric plate, respectively, one pair of photosensitive layers 41 and 51, one layer being placed between each of the surfaces of the ferroelectric plate and the corresponding transparent writing electrode, and one pair of erasing electrodes 6 and 7 on opposite edges of the ferroelectric plate, respectively. The device of this type gives a much finer picture than the device 40 due to the presence of the additional photosensitive layer 51.

It is thought that this invention can be understood from the foregoing descriptions. It is apparent that various changes and modifications can be made in the materials of the ferroelectric plate, the writing electrodes, and the photosensitive layer and the construction of the device without departing from the spirit and scope of this invention.

What is claimed is:

1. An electrooptic storage device comprising a ferroelectric plate, one pair of writing electrodes on opposite surfaces of said ferroelectric plate, respectively, and one pair of erasing electrodes on opposite edges, respectively, of said ferroelectric plate, said writing electrodes comprising a thermally sensitive transparent resistor material having a switching characteristic at a switching temperature Ts and said switching temperature Ts being lower than the Curie temperature Tc of the material of said ferroelectric plate.

2. An electrooptic storage device as claimed in claim 1, in which said ferroelectric plate is comprised of a transparent ferroelectric ceramic.

3. An electrooptic storage device as claimed in claim 1, in which said thermally sensitive resistor has a positive temperature coefficient of electrical resistance.

4. An electrooptic storage device as claimed in claim 1, in which said thermally sensitive resistor has a negative temperature coefficient of electrical resistance.

5. An electrooptic storage device as claimed in claim 1, further comprising an additional photosensitive layer between one of said surfaces of ferroelectric plate and one of said writing electrodes.

6. An electrooptic storage device as claimed in claim 5, in which said photosensitive layer is made of a photoconductive material.

7. An electrooptic storage device as claimed in claim 1, further comprising a pair of additional photosensitive layers, one said additional photosensitive layer being positioned between each surface of said ferroelectric plate and a corresponding writing electrode.

8. An electrooptic storage device as claimed in claim 7, in which said photosensitive layers are made of a photoconductive material.

* * * * *